United States Patent
Moon et al.

(10) Patent No.: US 9,722,089 B2
(45) Date of Patent: Aug. 1, 2017

(54) THIN FILM TRANSISTOR ARRAY PANEL AND MANUFACTURING METHOD THEREOF

(71) Applicant: SAMSUNG DISPLAY CO., LTD., Yongin, Gyeonggi-do (KR)

(72) Inventors: Yeon Keon Moon, Seoul (KR); Sang Woo Sohn, Gyeonggi-do (KR); Katsushi Kishimoto, Gyeonggi-do (KR); Takayuki Fukasawa, Seoul (KR); Sang Won Shin, Gyeonggi-do (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 93 days.

(21) Appl. No.: 14/482,413

(22) Filed: Sep. 10, 2014

(65) Prior Publication Data
US 2015/0228797 A1    Aug. 13, 2015

(30) Foreign Application Priority Data

Feb. 10, 2014    (KR) ......................... 10-2014-0014926

(51) Int. Cl.
*H01L 29/786*    (2006.01)
*H01L 29/66*    (2006.01)
(Continued)

(52) U.S. Cl.
CPC ........ *H01L 29/7869* (2013.01); *C23C 14/083* (2013.01); *C23C 14/086* (2013.01);
(Continued)

(58) Field of Classification Search
CPC ............... H01L 29/7869; H01L 29/786; H01L 29/41733; H01L 21/02565; H01L 2924/13069
See application file for complete search history.

(56) References Cited

U.S. PATENT DOCUMENTS

2009/0315026 A1* 12/2009 Jeong ...................... H01L 29/45
257/43
2010/0117074 A1* 5/2010 Yamazaki ......... H01L 29/66742
257/43
(Continued)

FOREIGN PATENT DOCUMENTS

| KR | 1020110128038 | 11/2011 |
| KR | 1020120014609 | 2/2012 |
| KR | 1020120132130 | 12/2012 |

OTHER PUBLICATIONS

"Metal Oxide Thin Film Transistor Based Sensing", 2016 IEEE 59th International Midwest Symposium on Circuits and Systems.*
(Continued)

*Primary Examiner* — Eva Y Montalvo
*Assistant Examiner* — Nga Doan
(74) *Attorney, Agent, or Firm* — F. Chau & Associates, LLC

(57) ABSTRACT

A thin film transistor array panel includes a substrate and a gate line disposed on the substrate. The gate line includes a gate electrode. A gate insulating layer is disposed on the gate line. An oxide semiconductor layer is disposed on the gate insulating layer. The oxide semiconductor layer at least partially overlaps the gate electrode. A data line is disposed on the oxide semiconductor layer. The data line includes a source electrode and a drain electrode facing the source electrode. The oxide semiconductor layer includes tungsten, indium, zinc, or tin.

10 Claims, 10 Drawing Sheets

(51) Int. Cl.
*H01L 21/02* (2006.01)
*C23C 14/08* (2006.01)
*C23C 14/34* (2006.01)

(52) U.S. Cl.
CPC .... *C23C 14/3464* (2013.01); *H01L 21/02422* (2013.01); *H01L 21/02488* (2013.01); *H01L 21/02554* (2013.01); *H01L 21/02565* (2013.01); *H01L 21/02581* (2013.01); *H01L 21/02631* (2013.01); *H01L 29/66969* (2013.01)

(56) References Cited

U.S. PATENT DOCUMENTS

| | | | | |
|---|---|---|---|---|
| 2011/0181806 | A1* | 7/2011 | Yamazaki | H01L 29/12 349/46 |
| 2012/0037901 | A1 | 2/2012 | Mori et al. | |
| 2012/0061661 | A1* | 3/2012 | Liu | H01L 29/78606 257/43 |
| 2012/0119206 | A1* | 5/2012 | Wang | H01L 27/1225 257/43 |
| 2013/0001545 | A1 | 1/2013 | Kuwabara et al. | |
| 2014/0042431 | A1* | 2/2014 | Wakana | H01L 29/7869 257/43 |
| 2015/0255611 | A1* | 9/2015 | Kishimoto | H01L 29/7869 257/43 |
| 2015/0318400 | A1* | 11/2015 | Morita | C01G 19/00 257/43 |

OTHER PUBLICATIONS

Chul Ho Kim et al., "Chemical Stability and Electrical Performance of Dual-Active-Layered Zinc-Tin-Oxide/Indium-Gallium-Zinc-Oxide Thin-Film Transistors Using a Solution Process" Applied Materials & Interfaces 5(13) 6108-6112 (2013).

Jong Hoon Lee et al., "Stability Characteristics of Gallium-doped Zinc-tin-oxide Thin Films Transistors Fabricated Using a Sol-gel Method" Journal of the Korean Physical Society 62(8) 1176-1182 (2013).

* cited by examiner

THIN FILM TRANSISTOR ARRAY PANEL AND MANUFACTURING METHOD THEREOF

CROSS-REFERENCE TO RELATED APPLICATION

This application claims priority under 35 U.S.C. §119 to Korean Patent Application No. 10-2014-0014926 filed in the Korean Intellectual Property Office on Feb. 10, 2014 the disclosure of which is incorporated by reference herein in its entirety.

TECHNICAL FIELD

Exemplary embodiments of the present invention relate to a thin film transistor array panel, and more particularly to thin film transistor array panel and a manufacturing method thereof.

DISCUSSION OF RELATED ART

A thin film transistor (TFT) may be used as a switching or driving element in a display device.

An amorphous silicon thin film transistor (a-Si TFT) may be used as a driving or switching element in the display device.

The a-Si TFT may be uniformly formed on a substrate.

Amorphous silicon may have low charge mobility, and performance of TFTs having amorphous silicon may be limited.

When using polysilicon as a semiconductor, charge mobility may be high and TFTs may be made with the polysilicon semiconductor.

TFTs may have high electron mobility, a high ON/OFF ratio of current and high uniformity.

An oxide semiconductor material layer may have high mobility, and may include an oxide-based material layer in a channel region of the TFT.

SUMMARY

Exemplary embodiments of the present invention may provide a thin film transistor array panel including an oxide semiconductor layer having resistance to external air (e.g. an oxide in external air) and increased thermal stability, and a manufacturing method thereof.

A thin film transistor array panel according to an exemplary embodiment of the present invention includes a substrate and a gate line disposed on the substrate. The gate line includes a gate electrode. A gate insulating layer is disposed on the gate line. An oxide semiconductor layer is disposed on the gate insulating layer. The oxide semiconductor layer at least partially overlaps the gate electrode. A data line is disposed on the oxide semiconductor layer. The data line includes a source electrode and a drain electrode facing the source electrode. The oxide semiconductor layer includes tungsten, indium, zinc, or tin.

The oxide semiconductor layer may have a tungsten content of about 0.1 at % to about 15 at %.

The oxide semiconductor layer may include zinc, and may have a zinc content of about 20 at % to about 45 at %.

The oxide semiconductor layer may include indium, and may have an indium content of about 5 at % to about 20 at %.

The oxide semiconductor layer may include tin, and may have a tin content of about 3 at % to about 10 at %.

A method for manufacturing a thin film transistor array panel according to an exemplary embodiment of the present invention includes forming a gate line including a gate electrode on a substrate. A gate insulating layer is formed on the gate line. An oxide semiconductor layer is formed on the gate insulating layer. A data line is formed including a source electrode and a drain electrode facing the source electrode on the oxide semiconductor layer. A passivation layer is formed on the source and drain electrodes. The oxide semiconductor layer includes tungsten, indium, zinc, or tin.

The oxide semiconductor layer may be formed by a first sputtering step using a first sputtering target including zinc oxide (ZnO) doped with tungsten. A second sputtering step may be performed using a second sputtering target including indium, zinc, and tin.

An amount of tungsten sputtered onto the oxide semiconductor layer may be controlled by a power that is applied to the first sputtering target.

The power applied to the first sputtering target may be about 80 W to about 250 W. The oxide semiconductor layer may be heat-treated at a temperature of about 200° C. to about 400° C.

The oxide semiconductor layer may have a tungsten content of about 0.1 at % to about 1.5 at %.

The oxide semiconductor layer may include zinc, and may have a zinc content of about 20 at % to about 45 at %.

The oxide semiconductor layer may include indium, and may have an indium content of about 5 at % to about 20 at %.

The oxide semiconductor layer may include tin, and may have a tin content of about 3 at % to about 10 at %.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DESCRIPTION OF THE EMBODIMENTS

Figure 1:
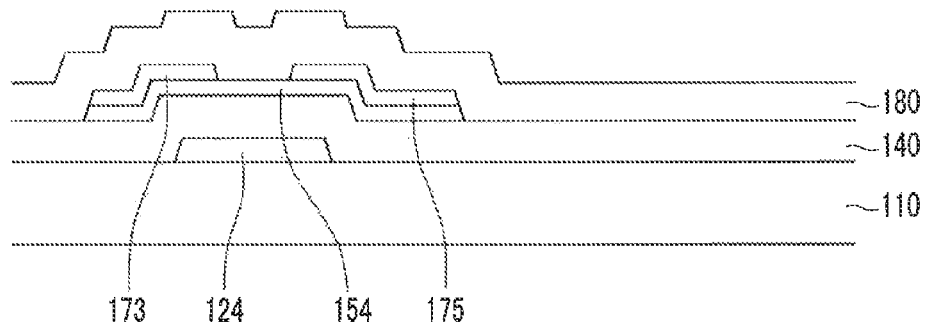
FIG. 1 is a cross-sectional view of a thin film transistor array panel according to an exemplary embodiment of the present invention.

Exemplary embodiments of the present invention will be described more fully hereinafter with reference to the accompanying drawings.

The present invention may be embodied in different forms and should not be construed as limited to the exemplary embodiments set forth herein.

In the drawings, the thickness of layers and regions may be exaggerated for clarity.

Like reference numerals may refer to like elements throughout the specification and drawings.

A thin film transistor array panel including an oxide semiconductor layer according to an exemplary embodiment of the present invention will now be described in more detail with reference to FIG. 1.

FIG. 1 is a cross-sectional view of a thin film transistor array panel according to an exemplary embodiment of the present invention.

A gate line (not shown) including a gate electrode 124 may be disposed on a substrate 110.

The substrate 110 may be an insulating substrate, and may contain plastic and/or glass.

The gate line may transmit a gate signal, and may extend in a horizontal direction.

The gate line may include a plurality of gate electrodes 124 that protrude therefrom.

The gate electrode 124 may include an aluminum-based metal. For example, the gate electrode 124 may include aluminum (Al) and an aluminum alloy, a silver-based metal including silver (Ag) and a silver alloy, a copper-based metal including copper (Cu) and copper manganese (CuMn), a molybdenum-based metal including molybdenum (Mo) and a molybdenum alloy, chromium (Cr), tantalum (Ta), and/or titanium (Ti).

The gate electrode 124 may include a transparent conductive material such as indium tin oxide (ITO), indium zinc oxide (IZO), and/or aluminum doped ZnO (AZO).

According to an exemplary embodiment of the present invention, the gate electrode 124 may include a single layer, but the gate electrode 124 is not limited thereto, and may include a double layer or a triple layer.

When as the gate electrode 124 includes the double layer, the gate electrode 124 may include a lower layer and an upper layer. The lower layer may include a molybdenum-based metal including molybdenum (Mo), a molybdenum alloy, chromium (Cr), a chromium alloy, titanium (Ti), a titanium alloy, tantalum (Ta), a tantalum alloy, manganese (Mn), and/or a manganese alloy.

The upper layer may include an aluminum-based metal including aluminum (Al) or an aluminum alloy, a silver-based metal including silver (Ag) or a silver alloy, and/or a copper-based metal including copper (Cu) or a copper alloy.

When the gate electrode 124 includes the triple layer, layers having different physical properties may be disposed adjacent to each other.

A gate insulating layer 140 may be disposed on the gate line including the gate electrode 124.

The gate insulating layer 140 may include an organic insulating material such as silicon oxide, silicon nitride or silicon oxynitride (SiON).

The gate insulating layer 140 may have a multi-layered structure in which two or more insulating layers (not shown) are included.

For example, the gate insulating layer 140 may include an upper part including silicon oxide and a lower part including silicon nitride, or the upper part may include silicon oxide and the lower part may include silicon nitride (SiON).

An oxide semiconductor layer 154 may be disposed on the gate insulating layer 140 and the oxide semiconductor layer 154 may be in contact with the gate insulating layer 140. When the gate insulating layer 140 is in contact with the oxide semiconductor layer 154 and the oxide semiconductor layer contains oxides, degradation of a channel layer may be prevented.

The oxide semiconductor layer 154 according to an exemplary embodiment of the present invention may include tungsten (W).

The oxide semiconductor layer 154 may include indium (In), zinc (Zn), and/or tin (Sn). For example, the oxide semiconductor layer 154 may include indium tin zinc oxide (ITZO) including indium (In), zinc (Zn), and tin (Sn).

The oxide semiconductor layer 154 according to an exemplary embodiment of the present invention may have a tungsten (W) content of about 0.1 at % to about 1.5 at %, a zinc (Zn) content of about 20 at % to about 45 at %, an indium (In) content of about 5 at % to about 20 at %, and a tin (Sn) content of about 3 at % to about 10 at %.

When the oxide semiconductor layer 154 according to exemplary embodiments of the present invention contains tungsten (W), reliability and thermal or external stability of a device may be increased. The content of tungsten (W) may be adjusted to control physical properties of the oxide semiconductor layer 154.

The oxide semiconductor layer 154 may be heat-treated and may have a semiconductor property and an insulating property.

The heat treatment temperature may be about 200° C. to about 400° C., and as an example, may be about 350° C.

An amorphous property can be reduced if the heat treatment temperature exceeds 400° C. The semiconductor property may be reduced when the heat treatment temperature is below about 200° C.

The oxide semiconductor layer 154 may be formed by a sputtering method.

The sputtering method may include a first sputtering target including tungsten (W) and a second sputtering target including indium (In), zinc (Zn), and/or tin (Sn).

For example, the first sputtering target may include zinc oxide (ZnO) doped with tungsten (W), and the first sputtering target may sputter zinc oxide (ZnO) doped with a tungsten (W) content of less than about 1 at %.

By simultaneously sputtering zinc oxide (ZnO) doped with a tungsten (W) content of less than about 1 at % and indium tin zinc oxide (ITZO), the simultaneously sputtered oxide semiconductor layer 154 containing tungsten and indium tin zinc oxide (W-ITZO) doped with a relatively small amount of tungsten (W) may be formed.

The oxide semiconductor layer 154 formed through the heat treatment process may have the semiconductor property.

A source electrode 173 and a drain electrode 175 may be disposed in a data line. The source electrode 173 and the drain electrode 175 may face each other and may be disposed on the oxide semiconductor layer 154 while exposing a channel region thereof.

The data line (not shown) may transmit a data signal, and may extend in a vertical direction and cross the gate line (not shown).

The data line may be connected to a plurality of source electrodes 173 that extend toward the gate electrode 124 and have a U-shape.

The drain electrode 175 may be separately disposed from the data line, and may extend upward from a center of the U-shape of the source electrode 173.

The shapes of the source and drain electrodes 173 and 175 according to exemplary embodiments of the present invention should not be construed as limited to the embodiments set forth herein. The source and drain electrodes 173 and 175 may have various shapes.

The source and drain electrodes 173 and 175 disposed in the data line may include an aluminum-based metal including aluminum (Al) or an aluminum alloy, a silver-based metal including silver (Ag) or a silver alloy, and/or a copper-based metal including copper (Cu) or a copper alloy.

According to an exemplary embodiment of the present invention, the source and drain electrodes 173 and 175 may include the single layer, but they are not limited thereto, and may include the double layer or the triple layer, for example.

When the source and drain electrodes 173 and 175 include the double layer, the source and drain electrodes 173 and 175 may include a lower layer and an upper layer. The lower layer may include a molybdenum-based metal including molybdenum (Mo), a molybdenum alloy, chromium (Cr), a chromium alloy, titanium (Ti), a titanium alloy, tantalum (Ta), tantalum alloy, manganese (Mn), and/or a manganese alloy, and the upper layer may include an aluminum-based metal including aluminum (Al) or an aluminum alloy, a silver-based metal including silver (Ag) or a silver alloy, and/or a copper-based metal including copper (Cu) or a copper alloy.

When as the source and drain electrodes 173 and 175 include the triple layer, the layers of the triple layer may have different physical properties.

A passivation layer 180 may be disposed on the source and drain electrodes 173 and 175. The passivation layer 180 may cover the channel region of the oxide semiconductor layer 154.

The passivation layer 180 may include silicon nitride or silicon oxide.

A contact hole (not shown) may be disposed in the passivation layer 180 and may partially expose the drain electrode 175. The drain electrode 175 may be connected to a field generating electrode such as a pixel electrode through the contact hole.

Figure 2:
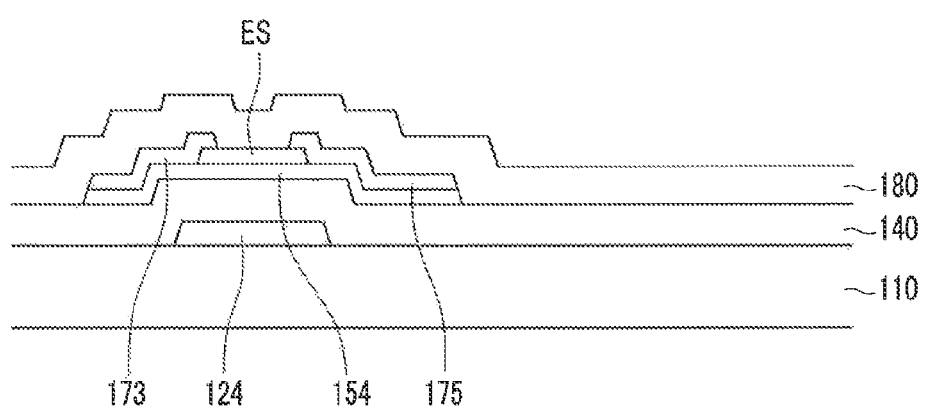
FIG. 2 is a cross-sectional view of a thin film transistor array panel according to an exemplary embodiment of the present invention.

FIG. 2 is a cross-sectional view of a thin film transistor array panel according to an exemplary embodiment of the present invention.

Referring to FIG. 2, the thin film transistor array panel may include an etch stopper ES.

The gate electrode 124 corresponding to a control electrode in the thin film transistor array panel may be disposed on the substrate 110, and the gate insulating layer 140 may be disposed on the substrate 110 and may cover the gate electrode 124.

An oxide semiconductor layer 154 may be disposed on the gate insulating layer 140.

The oxide semiconductor layer 154 according to an exemplary embodiment of the present invention may include tungsten (W).

The oxide semiconductor layer 154 may include indium (In), zinc (Zn), and/or tin (Sn). For example, the oxide semiconductor layer 154 may include indium tin zinc oxide (ITZO) including indium (In), zinc (Zn), and tin (Sn).

The oxide semiconductor layer 154 according to an exemplary embodiment of the present invention may have a tungsten (W) content of about 0.1 at % to about 1.5 at %, a zinc (Zn) content of about 20 at % to about 45 at %, an indium (In) content of about 5 at % to about 20 at %, and a tin (Sn) content of about 3 at % to about 10 at %.

The oxide semiconductor layer 154 according to exemplary embodiments of the present invention may include tungsten (W) and thus reliability and thermal or external stability of a device may be increased. The tungsten (W) content may be adjusted to control physical properties of the oxide semiconductor layer 154.

For example, the oxide semiconductor layer 154 may be heat-treated and may have a semiconductor property and may have an insulating property.

The heat treatment temperature may be about 200° C. to about 400° C. For example, the heat treatment temperature may be about 350° C.

The amorphous property can be reduced if the heat treatment temperature exceeds about 400° C. The semiconductor property may be reduced if the heat treatment temperature is below about 200° C.

According to an exemplary embodiment of the present invention, the oxide semiconductor layer 154 may be formed by a sputtering method.

The sputtering method may include a first sputtering target including tungsten (W) and a second sputtering target including indium (In), zinc (Zn), and/or tin (Sn).

For example, the first sputtering target may include zinc oxide (ZnO) doped with tungsten (W). The first sputtering target may sputter zinc oxide (ZnO) doped with a tungsten (W) content of less than about 1 at %.

By simultaneously sputtering zinc oxide (ZnO) doped with a tungsten (W) content of less than about 1 at % and indium tin zinc oxide (ITZO), the oxide semiconductor layer 154 including tungsten ITZO (W-ITZO) doped with a relatively small amount of tungsten (W) may be formed.

The oxide semiconductor layer 154 formed through the heat treatment process may have the semiconductor property.

An etching prevention layer ES may be disposed in the channel region of the oxide semiconductor layer 154.

The source and drain electrodes 173 and 175 included in the data line may be disposed on the oxide semiconductor layer 154, may be spaced apart from each other and may overlap edges of the etching prevention layer ES.

The etching prevention layer ES may be partially exposed at a position where the source and drain electrodes 173 and 175 are spaced apart from each other.

The etching prevention layer ES may include a silicon-based oxide or a silicon-based nitride.

The passivation layer 180 may be disposed on the source and drain electrodes 173 and 175.

The passivation layer 180 may fill a space between the source and drain electrodes 173 and 175 and may cover the etching prevention layer ES.

A contact hole (not shown) may be disposed in the passivation layer 180 and may partially expose the drain electrode 175. The drain electrode 175 may be connected to a field generating electrode such as a pixel electrode through the contact hole.

Those elements and features not described with respect to FIG. 2 may be assumed to be substantially the same as those corresponding features previously described with respect to FIG. 1.

A manufacturing method of a thin film transistor array according to an exemplary embodiment of the present invention will now be described in more detail with reference to FIGS. 3 to 6.

FIGS. 3 to 6 are cross-sectional views showing a manufacturing method of the thin film transistor array panel according to an exemplary embodiment of the present invention. The manufacturing method may be substantially the same as that of the manufacturing method of the thin film transistor array panel of FIG. 1, except that the etching prevention layer ES may be formed.

Figure 3:
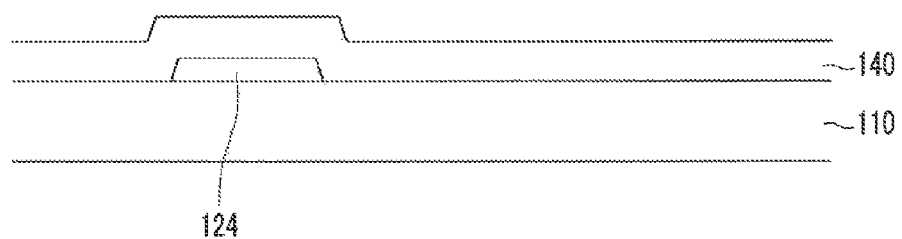
FIGS. 3 to 6 are cross-sectional views showing a manufacturing method of the thin film transistor array panel according to an exemplary embodiment of the present invention.

Referring to FIG. 3, the gate insulating layer 140 may be formed on the substrate 110 to cover the gate electrode 124 included in a gate line.

The gate insulating layer 140 may include silicon oxide, silicon nitride, and/or silicon oxynitride (SiON), and may be formed by a sputtering method.

The gate insulating layer may include the single layer. The gate insulating layer may include the double layer including silicon oxide and silicon nitride or silicon oxide and silicon oxynitride (SiON).

The layer including silicon oxide may be adjacent to the oxide semiconductor layer 154 that will be described in more detail below.

Figure 4:
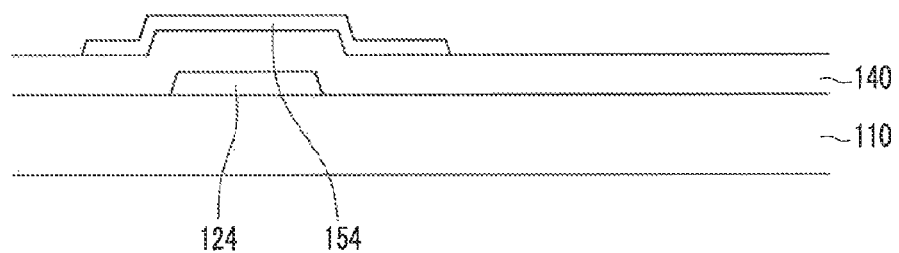

Referring to FIG. 4, a semiconductor material layer may be formed on the gate insulating layer 140, and may be patterned to form the oxide semiconductor layer 154.

The oxide semiconductor layer 154 according to an exemplary embodiment of the present invention may include an oxide semiconductor.

The oxide semiconductor layer 154 according to an exemplary embodiment of the present invention may include tungsten (W).

The oxide semiconductor layer 154 may include indium (In), zinc (Zn), and/or tin (Sn). For example, the oxide semiconductor layer may include indium tin zinc oxide (ITZO) including indium (In), zinc (Zn), and tin (Sn).

The oxide semiconductor layer 154 may have a tungsten (W) content of about 0.1 at % to about 1.5 at %, a zinc (Zn) content of about 20 at % to about 45 at %, an indium (In) content of about 5 at % to about 20 at %, and a tin (Sn) content of about 3 at % to about 10 at %.

According to an exemplary embodiment of the present invention, a chemical vapor deposition method, a sputtering method, a pulse laser deposition method, an atomic layer deposition method, a spin coating method, an inkjet printing method, a roll-to-roll method, or a nano-imprinting method may be used to form the semiconductor material layer.

The sputtering method may include a first sputtering target including tungsten (W) and a second sputtering target including indium (In), zinc (Zn), and/or tin (Sn).

For example, the first sputtering target may include zinc oxide (ZnO) doped with tungsten (W). The first sputtering target may sputter zinc oxide (ZnO) doped with a tungsten (W) content of less than about 1 at %.

The first sputtering target may receive a power of about 80 W to about 200 W.

The oxide semiconductor layer 154 according to exemplary embodiments of the present invention may include tungsten (W) and thus reliability and stability thereof may be increased. Physical properties of the oxide semiconductor layer 154 may be changed according to the content of tungsten (W) which may be controlled by the power control described above.

The power applied to the first sputtering target may be increased and the content of tungsten (W) may be increased.

By simultaneously sputtering zinc oxide (ZnO) doped with a tungsten (W) content of less than about 1 at % and indium tin zinc oxide (ITZO), the oxide semiconductor layer 154 including tungsten. ITZO (W-ITZO) doped with a small amount of tungsten (W) may be formed, and the content of tungsten (W) may be adjusted by the power applied to the sputtering target.

The semiconductor layer 154 may be heat-treated and may have a semiconductor property and an insulating property.

The heat treatment temperature may be about 200° C. to about 400° C. For example, the heat treatment temperature may be about 350° C.

The amorphous property can be reduced if the heat treatment temperature exceeds about 400° C. The semiconductor property may be reduced if the heat treatment temperature is below about 200° C.

Figure 5:
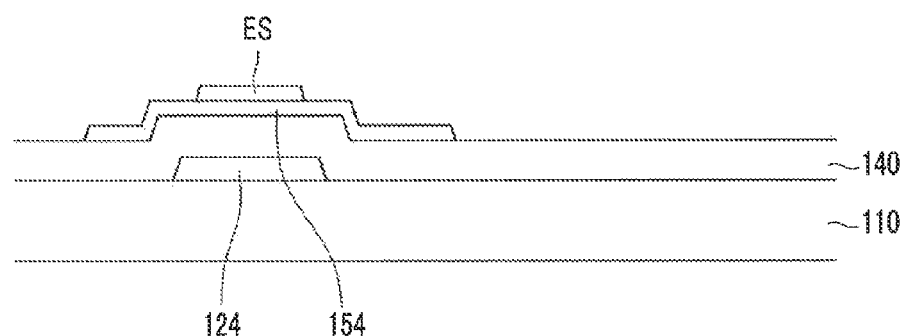

Referring to FIG. 5, an etching prevention layer ES may be formed on a position corresponding to the channel region of the oxide semiconductor layer 154.

The etching prevention layer ES may include silicon-based oxide or silicon-based nitride.

The etching prevention layer ES may prevent silicon oxide ($SiO_x$) or vapor, which may be generated from permeating into the channel region of the oxide semiconductor layer 154.

Figure 6:
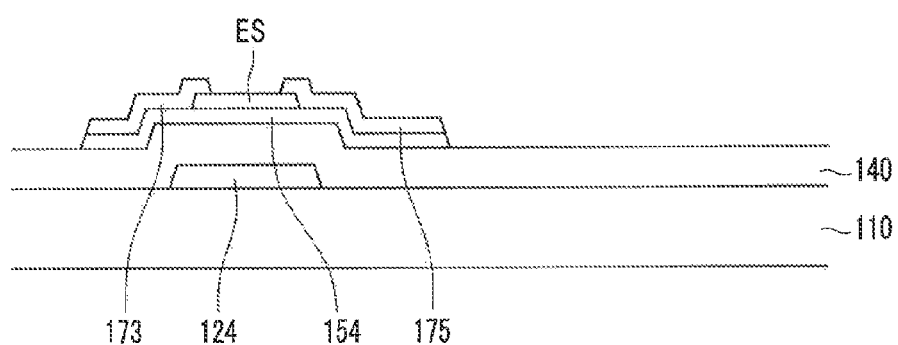

Referring to FIG. 6, the source and drain electrodes 173 and 175 may overlap edges of the etching prevention layer ES.

The source and drain electrodes 173 and 175 may face each other and may be disposed on opposite sides of the gate electrode 124.

The etching prevention layer ES may be partially exposed at a position where the source and drain electrodes 173 and 175 are spaced apart from each other.

The source and drain electrodes 173 and 175 may each include an aluminum-based metal including aluminum (Al) or an aluminum alloy, a silver-based metal including silver (Ag) or a silver alloy, a copper-based metal including copper (Cu) or a copper alloy, a molybdenum-based metal including molybdenum (Mo) or a molybdenum alloy, chromium (Cr), tantalum (Ta), and/or titanium (Ti).

For example, the molybdenum alloy may include Mo—Nb or Mo—Ti.

The source and drain electrodes 173 and 175 may include a transparent conductive material such as indium tin oxide (ITO), indium zinc oxide (IZO) or aluminum zinc oxide (AZO).

The source and drain electrodes 173 and 175 may have a multi-layered structure including two or more conductive layers (not shown).

For example, the source and drain electrodes 173 and 175 may include Mo/Al/Mo, Mo/Al, Mo/Cu, CuMn/Cu and/or Ti/Cu.

The passivation layer 180 may be formed on the gate insulating layer 140 and may cover an exposed portion of the etching prevention layer ES and the source and drain electrodes 173 and 175.

The passivation layer 180 may include silicon oxide, silicon nitride, silicon oxynitride, or an organic layer.

A contact hole (not shown) may be formed in the passivation layer 180. The contact hole may partially expose the drain electrode 175. The drain electrode 175 may be connected to a field generating electrode such as a pixel electrode through the contact hole.

The thin film transistor array panel including the oxide semiconductor layer manufactured by the manufacturing method described above may have increased thermal reliability and increased stability against external air such that a relatively small amount of tungsten doping may increase reliability of the thin film transistor array panel.

FIGS. 7 to 10 are graphs showing physical properties of an oxide semiconductor layer according to an exemplary embodiment of the present invention.

Figure 7:
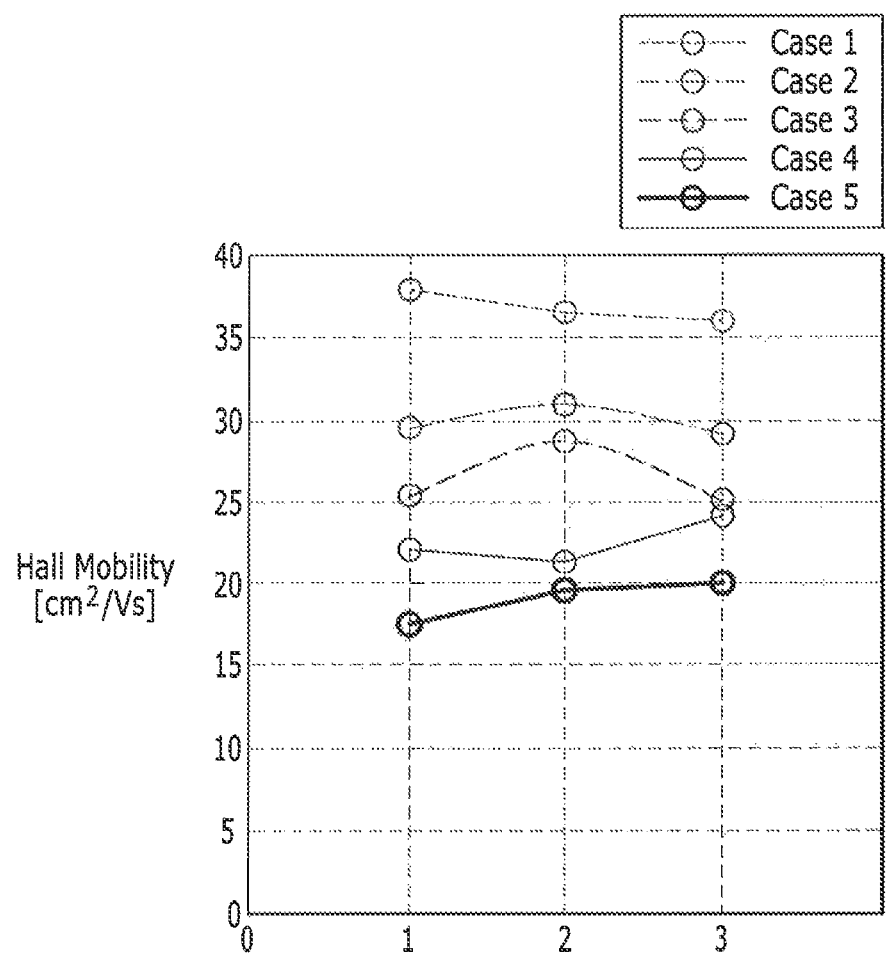
FIGS. 7 to 10 are graphs showing physical properties of an oxide semiconductor layer according to an exemplary embodiment of the present invention.
Figure 8:
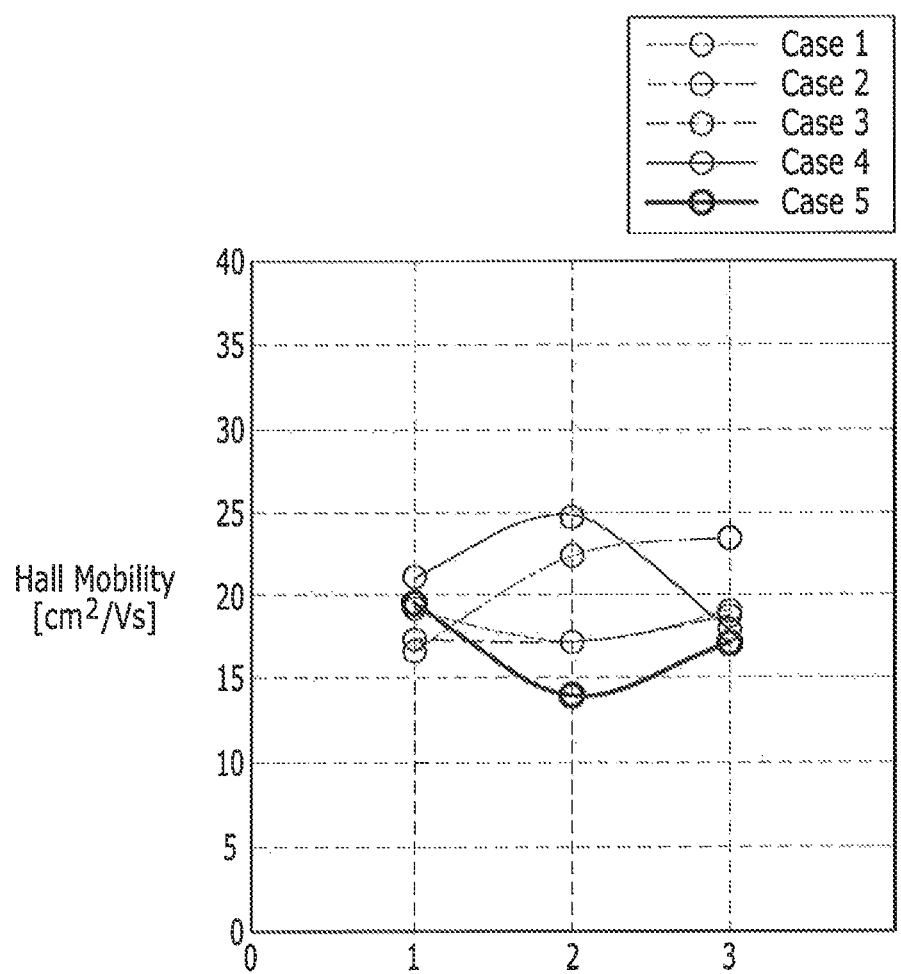
Figure 9:
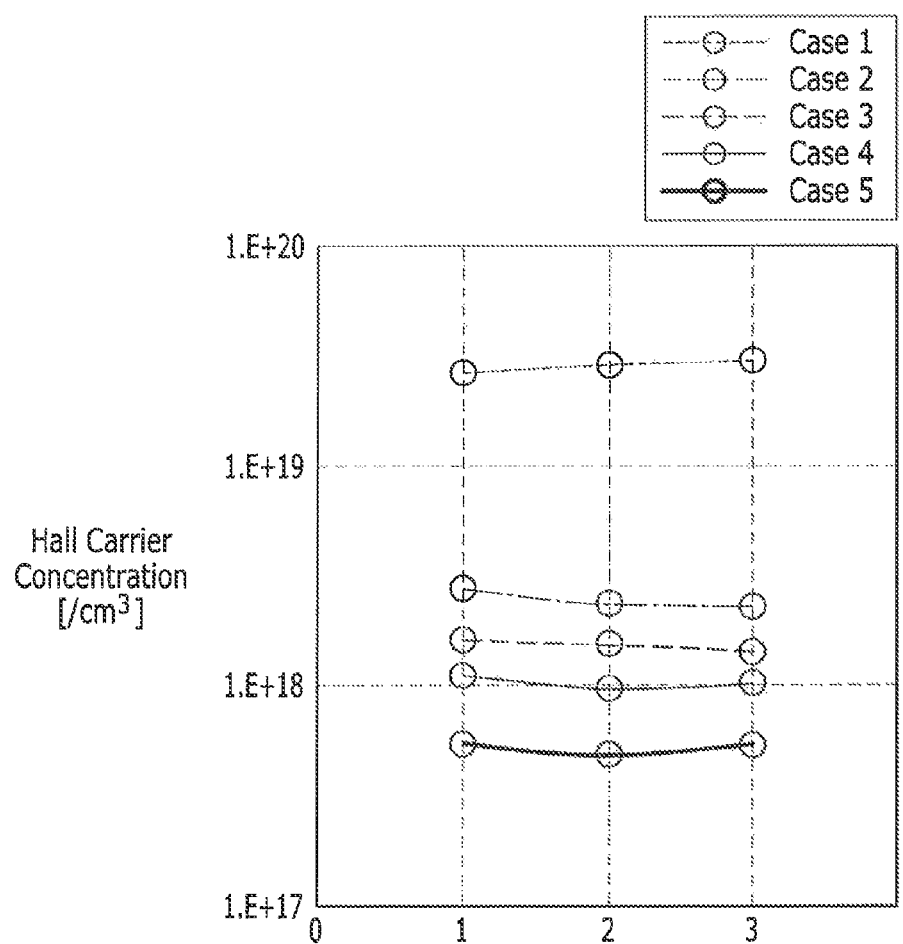
Figure 10:
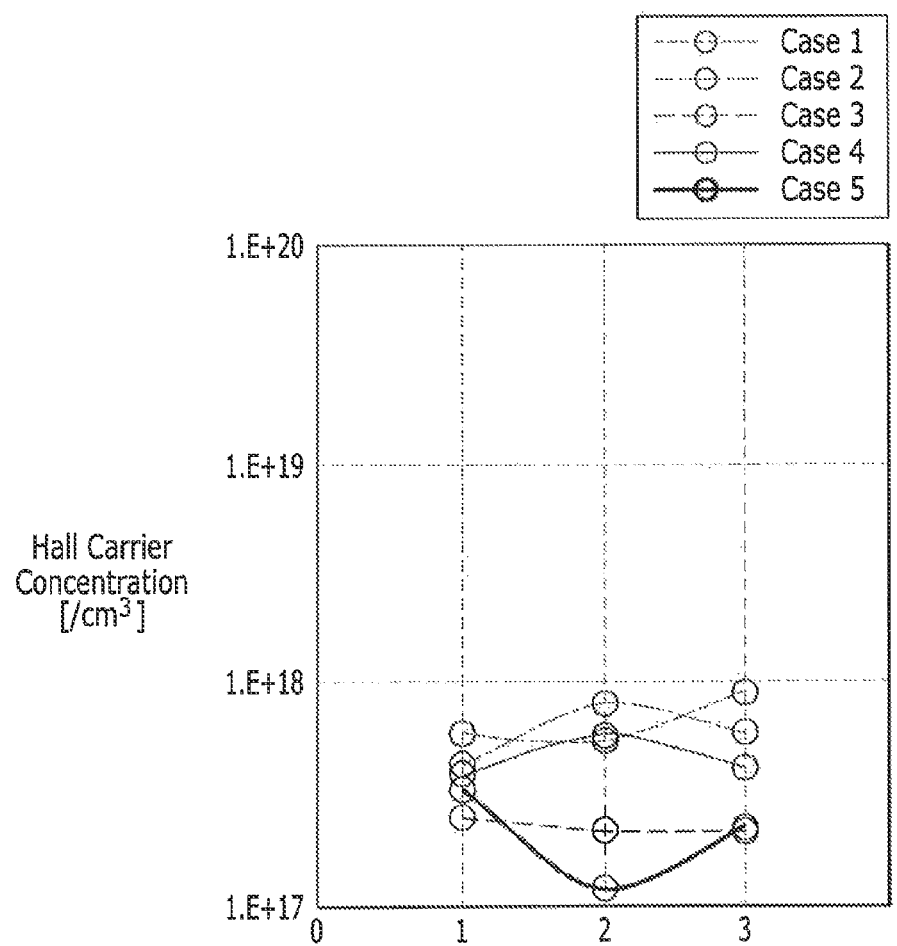

FIGS. 7 and 8 are graphs of Hall mobility before and after heat treatment, and FIGS. 9 and 10 are graphs of Hall carrier concentration before and after heat treatment.

Each example will be described in more detail below.

Case 1 is a comparative example. In case 1 an oxide semiconductor is formed by sputtering ITZO at 150 W. Case 2 is an oxide semiconductor formed by simultaneously sputtering ITZO at 150 W and ZnO at 80 W. Case 3 is an oxide semiconductor formed by sputtering ITZO at 150 W and ZnO at 150 W.

In case 4, according to an exemplary embodiment of the present invention, an oxide semiconductor is formed by sputtering ITZO at 150 W and ZnO doped with tungsten at 80 W. Case 5 is an oxide semiconductor formed by sputtering ITZO at 150 W and ZnO doped with tungsten (W) at 150 W.

FIG. 7 shows a graph illustrating Hall mobility of each example.

It can be seen that the cases 1 to 3 show relatively high Hall mobility, while cases 4 to 5 show relatively low Hail mobility compared with the comparative example of case 1.

When the Hall mobility is observed after an hour of heat treatment (FIG. 8), it can be seen that the Hall mobility is considerably decreased in cases 1 to 3.

It can be seen that the Hall mobility has minimally decreased in the cases 4 to 5.

For example, according to the results described above, it can be seen that the physical properties of the oxide semiconductor layer (Hall mobility) according to exemplary embodiments of the present invention have minimally changed from before to after the heat treatment, which shows increased stability of the oxide semiconductor layer.

FIG. 9 shows similar result to that of FIG. 7.

Cases 1 to 3 are comparative examples. Cases 1 to 3 show a relatively high hall carrier concentration, while cases 4 to 5 show a relatively low hall carrier concentration compared with the comparative examples.

Referring to FIG. 10, the hail carrier concentration is considerably decreased in cases 1 to 3, while the hall carrier concentration is constantly maintained in cases 4 to 5 regardless of the heat treatment.

The oxide semiconductor layer according to exemplary embodiments of the present invention has limited changes to its physical properties such as the Hall mobility and Hall carrier concentration whether it is heat treated or not.

Thus, the oxide semiconductor layer that is not substantially affected by an external environment or a manufacturing process and has substantially constant physical properties (e.g., high mobility) may be provided, and the thin film transistor array panel with increased reliability may be formed.

While the present invention has been shown and described with reference to the exemplary embodiments thereof, it will be apparent to those of ordinary skill in the art that various changes in form and detail may be made thereto without departing from the spirit and scope of the invention as defined by the claims.

What is claimed is:

1. A thin film transistor array panel, comprising:
   a substrate;
   a gate line disposed on the substrate, wherein the gate line comprises a gate electrode;
   a gate insulating layer disposed on the gate line;
   an oxide semiconductor layer disposed on the gate insulating layer, wherein the oxide semiconductor layer at least partially overlaps the gate electrode; and
   a data line disposed on the oxide semiconductor layer, wherein the data line includes a source electrode and a drain electrode facing the source electrode,
   wherein the oxide semiconductor layer comprises tungsten, wherein the oxide semiconductor layer further comprises indium, zinc, and/or tin, and wherein the tungsten content of the oxide semiconductor layer is about 0.1 at % to about 1.5 at %.

2. The panel of claim 1, wherein the oxide semiconductor layer comprises zinc, and wherein the oxide semiconductor layer has a zinc content of about 20 at % to about 45 at %.

3. The panel of claim 2, wherein the oxide semiconductor layer comprises indium, and wherein the oxide semiconductor layer has an indium content of about 5 at % to about 20 at %.

4. The panel of claim 3, wherein the oxide semiconductor layer comprises tin, and wherein the oxide semiconductor layer has a tin content of about 3 at % to about 10 at %.

5. A thin film transistor array panel, comprising:
   a substrate;
   a gate electrode disposed on the substrate;
   a gate insulating layer disposed on the substrate and the gate electrode;
   an oxide semiconductor layer disposed on the gate insulating layer, wherein the oxide semiconductor layer comprises tungsten, and wherein the tungsten content of the oxide semiconductor layer is less than about 1 at %; and
   a source electrode and a drain electrode disposed on the gate insulating layer, wherein the source electrode and the drain electrode face each other and are spaced apart from each other to form a channel region therebetween.

6. The thin film transistor array panel of claim 5, further comprising a passivation layer disposed on the source electrode, the oxide semiconductor layer and the drain electrode.

7. The thin film transistor array panel of claim 5, further comprising an etching prevention layer disposed on the oxide semiconductor layer in the channel region between the source and drain electrodes.

8. The thin film transistor array panel of claim 5, wherein the oxide semiconductor layer comprises a tungsten content of 0.1 at % to about 1.0 at %.

9. The thin film transistor array panel of claim 5, wherein the oxide semiconductor layer further comprise indium, zinc, or tin.

10. The thin film transistor array panel of claim 5, wherein the oxide semiconductor layer comprises zinc, and wherein the oxide semiconductor layer has a zinc content of about 20 at % to about 45 at %.

* * * * *